United States Patent
Hirota et al.

(10) Patent No.: US 8,664,631 B2
(45) Date of Patent: Mar. 4, 2014

(54) NONVOLATILE MEMORY DEVICE

(75) Inventors: Jun Hirota, Kanagawa-ken (JP); Yoko Iwakaji, Kanagawa-ken (JP); Moto Yabuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/236,713

(22) Filed: Sep. 20, 2011

(65) Prior Publication Data
US 2012/0235107 A1 Sep. 20, 2012

(30) Foreign Application Priority Data

Mar. 15, 2011 (JP) .................................. 2011-056614

(51) Int. Cl.
*H01L 45/00* (2006.01)
(52) U.S. Cl.
USPC ...................................... 257/2; 257/E45.001
(58) Field of Classification Search
USPC ...................................... 257/2, 3, 4, 5, 6, 7, 8
See application file for complete search history.

(56) References Cited

U.S. PATENT DOCUMENTS

| 2009/0168492 A1* | 7/2009 | Thorp et al. ................... 365/148 |
| 2009/0294751 A1* | 12/2009 | Kiyotoshi ........................ 257/4 |
| 2010/0176488 A1* | 7/2010 | Aoyama ....................... 257/536 |
| 2011/0186797 A1* | 8/2011 | Herner ............................. 257/2 |

FOREIGN PATENT DOCUMENTS

JP 2010-219343 9/2010

OTHER PUBLICATIONS

U.S. Appl. No. 12/873,604, filed Sep. 1, 2010, Yoko Iwakaji, et al.
U.S. Appl. No. 13/052,143, filed Mar. 21, 2011, Yoko Iwakaji, et al.

* cited by examiner

*Primary Examiner* — Kimberly Rizkallah
*Assistant Examiner* — Mounir Amer
(74) *Attorney, Agent, or Firm* — Oblon, Spivak, McClelland, Maier & Neustadt, L.L.P.

(57) ABSTRACT

According to one embodiment, a nonvolatile memory device includes a word line interconnect layer, a bit line interconnect layer, a pillar, and charge bearing members. The word line interconnect layer includes a plurality of word lines extending in a first direction. The bit line interconnect layer includes a plurality of bit lines extending in a second direction that intersects the first direction. The pillar is disposed between each of the word lines and each of the bit lines. The charge bearing members contain a negative fixed charge, and provided on side faces of the pillars. The pillars includes a diode film provided with a p-type layer and an n-type layer and a variable resistance film stacked on the diode film. The charge bearing member is disposed on side faces of the p-type layer, and is not disposed on side faces of the n-type layer.

6 Claims, 14 Drawing Sheets

NO FIXED CHARGE

NEGATIVE FIXED CHARGE
(ELECTRONS)

POSITIVE FIXED CHARGE
(ELECTRON HOLES)

NO FIXED CHARGE

POSITIVE FIXED CHARGE AT INTERFACE
BETWEEN n+ -TYPE LAYER AND i-TYPE LAYER

NONVOLATILE MEMORY DEVICE

CROSS-REFERENCE TO RELATED APPLICATIONS

This application is based upon and claims the benefit of priority from the prior Japanese Patent Application No. 2011-056614, filed on Mar. 15, 2011; the entire contents of which are incorporated herein by reference.

FIELD

Embodiments described herein relate generally to a nonvolatile memory device.

BACKGROUND

In recent years a phenomenon has been discovered in which certain metal oxide-based materials can have a low resistance state and a high resistance state when a voltage is applied, depending on the resistivity prior to application of the voltage and the magnitude of the applied voltage. Interest has been focused on new memory devices that use this phenomenon. This memory device is referred to as a Resistance Random Access Memory (ReRAM). In this type of memory device, it is necessary to apply a set voltage to a variable resistance film to switch the variable resistance film from the high resistance state to the low resistance state, and apply a reset voltage to switch from the low voltage state to the high voltage state, by applying a voltage between the word line and the bit line. When either the set voltage or reset voltage is applied to the variable resistance film and not less than a specific quantity of current flows, the variable resistance film switches the resistance state.

A 3-dimensional cross-point structure has been proposed for the structure of an actual ReRAM device, in which memory cells are disposed at the intersection points of word lines (WL) and bit lines (BL), from the point of view of large scale integration. However, in the 3-dimensional cross-point structure memory device, when a voltage is applied to write data to a given memory cell, a voltage is also applied in the opposite direction to other memory cells which have not been selected. Consequently, it is necessary to provide each memory cell with a variable resistance film and a current selection element. A pin type silicon diode film in which a p-type silicon layer into which an acceptor is introduced, an i-type silicon layer into which impurities are not introduced, and an n-type silicon layer into which a donor is introduced are stacked, for example, is used as the current selection element.

DETAILED DESCRIPTION

In general, according to one embodiment, a nonvolatile memory device includes a word line interconnect layer, a bit line interconnect layer, a pillar, and charge bearing members. The word line interconnect layer includes a plurality of word lines extending in a first direction. The bit line interconnect layer includes a plurality of bit lines extending in a second direction that intersects the first direction. The pillar is disposed between each of the word lines and each of the bit lines. The charge bearing members contain a negative fixed charge, and provided on side faces of the pillars. The pillars includes a diode film provided with a p-type layer and an n-type layer and a variable resistance film stacked on the diode film. The charge bearing member is disposed on side faces of the p-type layer, and is not disposed on side faces of the n-type layer.

Various embodiments will be described hereinafter with reference to the accompanying drawings.

Figure 1:
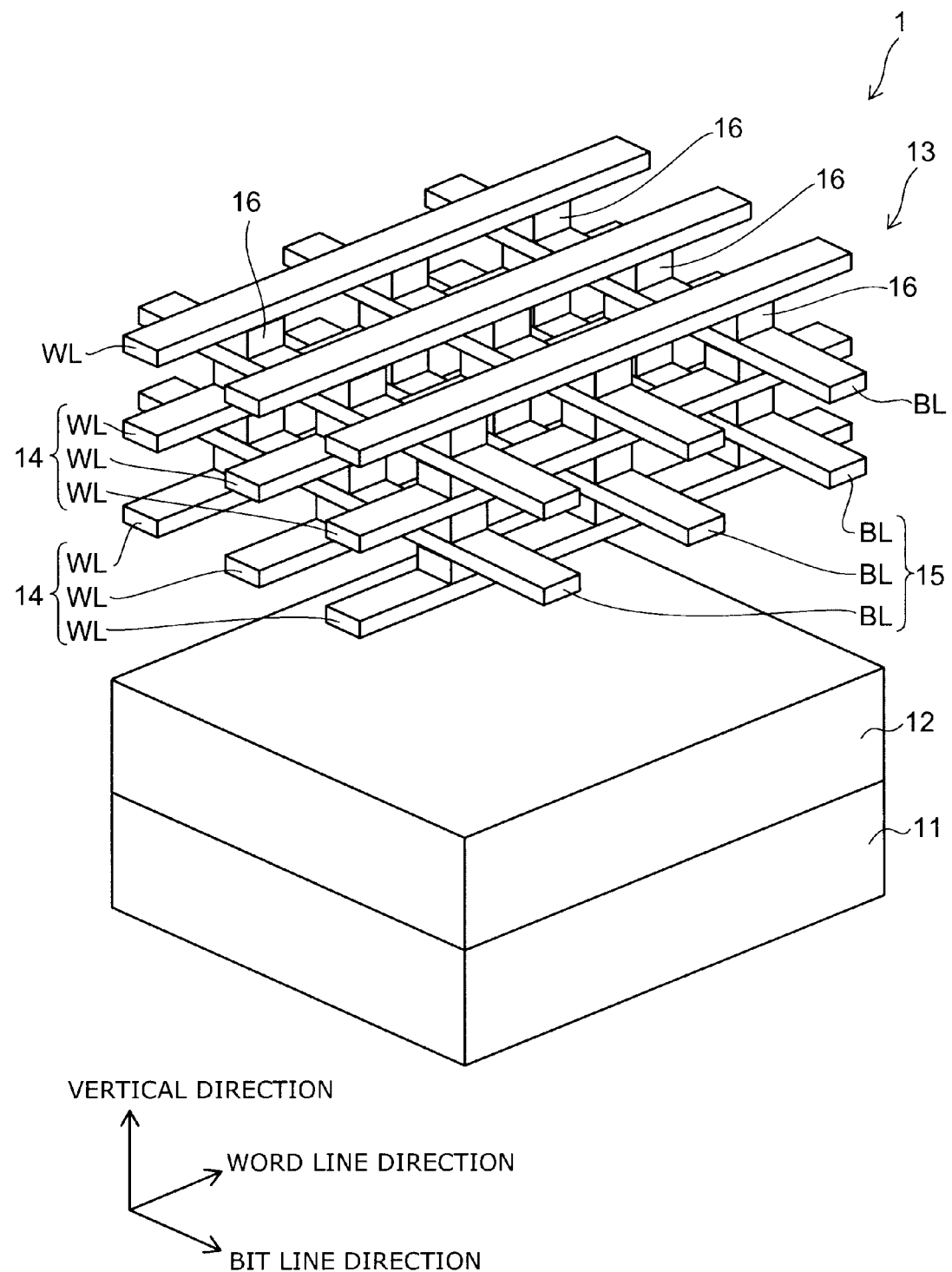
FIG. 1 is a perspective view illustrating a nonvolatile memory device according to a first embodiment.
Figure 2:
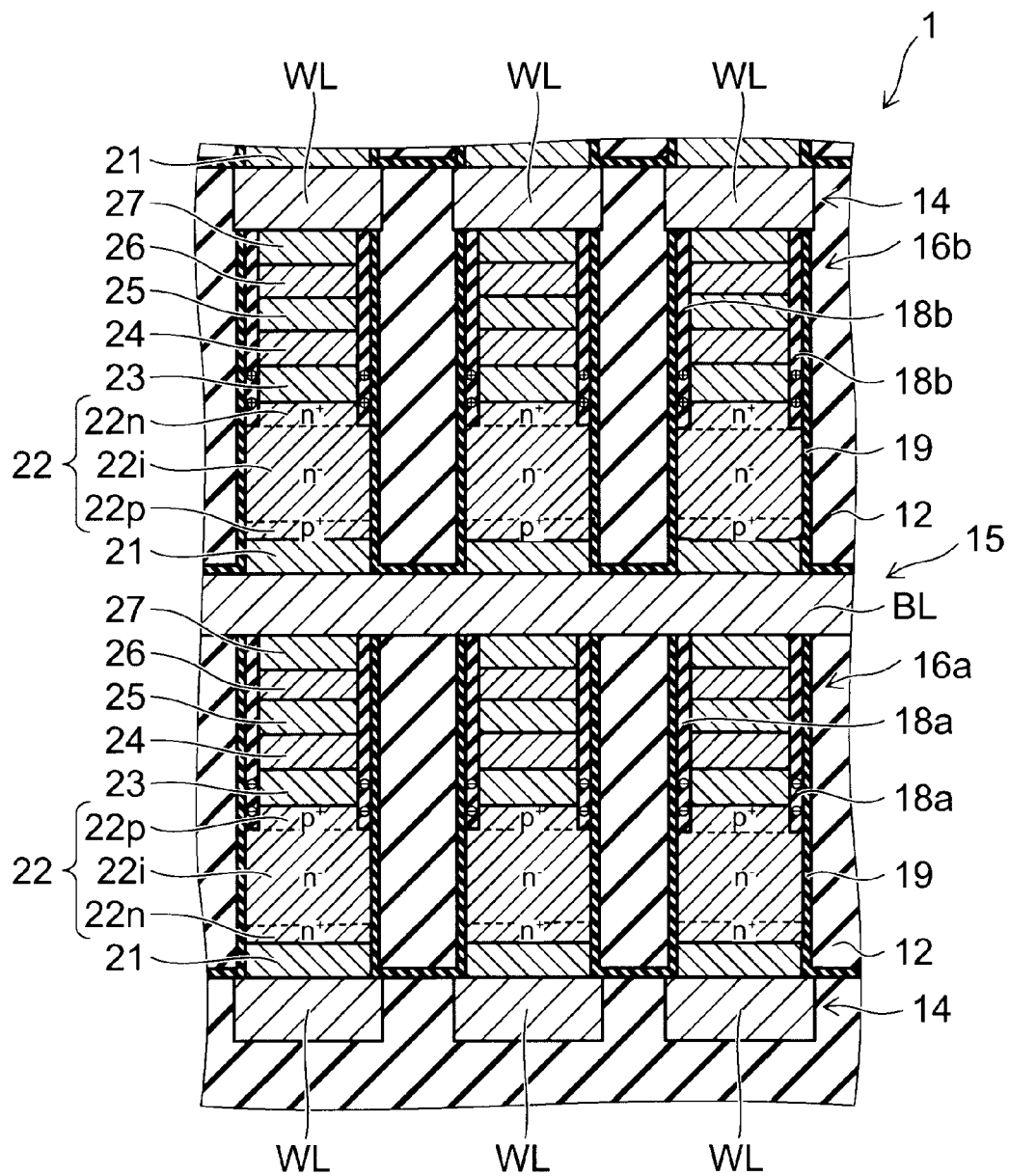
FIG. 2 is a cross-sectional view illustrating the nonvolatile memory device according to the first embodiment.

FIG. 1 is a perspective view illustrating a nonvolatile memory device according to the embodiment, and FIG. 2 is a cross-sectional view illustrating the nonvolatile memory device according to the embodiment.

The nonvolatile memory device according to the embodiment is a ReRAM.

As illustrated in FIG. 1, in a nonvolatile memory device 1 according to the embodiment, a silicon substrate 11 is provided, and a drive circuit (not illustrated on the drawing) of the nonvolatile memory device 1 is formed on a top layer portion and a top face of the silicon substrate 11. An inter-layer insulating film 12 made from silicon oxide, for example, is provided on the silicon substrate 11 encapsulating the drive circuit, and a memory cell unit 13 is provided on the inter-layer insulating film 12.

In the memory cell unit 13, word line interconnect layers 14 including a plurality of word lines WL extending in a direction parallel to a top face of the silicon substrate 11 (hereafter referred to as a "word line direction") and bit line interconnect layers 15 including a plurality of bit lines BL extending in a direction parallel to the top face of the silicon substrate 11 and that intersects the word line direction at, for example, right angles (hereafter referred to as a "bit line direction") are stacked alternately, with inter-layer insulating film 12 (see FIG. 2) disposed therebetween. The word lines WL and the bit lines BL may, for example, be formed from tungsten (W). Also, there is no contact between word lines WL, between bit lines BL, or between word lines WL and bit lines BL.

Also, pillars 16 extending in the direction normal to the top face of the silicon substrate 11 (hereafter referred to as the "vertical direction") are provided at the points of closest proximity between each of the word line WL and each of the bit line BL. The pillars 16 are formed between word lines WL and bit lines BL. A single memory cell is constituted from a single pillar 16. In other words, a nonvolatile memory device 1 is a cross-point type device in which memory cells are disposed at each of the nearest neighbor of the word lines WL and the bit lines BL.

Hereinafter, a configuration of the pillar 16 will be described with reference to FIG. 2.

As illustrated in FIG. 2, there are two types of pillar 16: a pillar 16a in which the word line WL is disposed below the pillar and the bit line BL is disposed above the pillar, and a pillar 16b in which the word line WL is disposed above the pillar and the bit line BL is disposed below the pillar. The aspect ratio of the pillars 16 is, for example, not less than 4.

In the pillar 16a, a lower electrode film 21, a silicon diode film 22, an intermediate electrode film 23, a barrier metal 24, a variable resistance film 25, a barrier metal 26, and an upper electrode film 27 are stacked in that order from below (word line side) to above (bit line side). The lower electrode film 21 contacts the word line WL, and the upper electrode film 27 contacts the bit line BL.

The lower electrode film 21 is made from, for example, titanium nitride (TiN), and the film thickness is, for example, 1 to 10 nm. The silicon diode film 22 is made from polysilicon, and includes an $n^+$-type layer $22n$ of $n^+$-conductivity type, an $n^-$-type layer $22i$ of $n^-$-conductivity type, and a $p^+$-type layer $22p$ of $p^+$-conductivity type stacked in that order from the lower layer side. The $n^-$-type layer $22i$ has an effective impurity concentration lower than the effective impurity concentration of the $n^+$-type layer $22n$ and the $p^+$-type layer $22p$. The $n^+$-type layer $22n$, the $n^-$-type layer $22i$, and the $p^+$-type layer $22p$ are stacked in this order, so a pin-type diode is formed. As a result in the silicon diode film 22 of the pillar 16a, a direction from the bit line BL towards the word line WL is a forward direction, a direction from the word line WL towards the bit line BL is a reverse direction.

Instead of the $n^-$-type layer $22i$, an i-type layer made from an intrinsic semiconductor may be provided. In the patent specification, "effective impurity concentration" means the concentration of impurities that contribute to conductivity in a semiconductor material, for example, when a semiconductor material includes both a donor impurity and an acceptor impurity, it refers to the concentration of active impurities after subtracting the amount by which the donors and acceptors cancel each other out.

The intermediate electrode film 23 is formed from, for example, titanium silicide ($TiSi_2$). The variable resistance film 25, which is formed, for example, from a metal oxide, may have not less than two levels of resistance value, and can be switched between resistance values by inputting a predetermined electrical signal. The barrier metal 26 is formed from, for example, titanium nitride (TiN). The upper electrode film 27 is formed from, for example, tungsten.

In the pillar 16b, the lower electrode film 21, the silicon diode film 22, the intermediate electrode film 23, the barrier metal 24, the variable resistance film 25, the barrier metal 26, and the upper electrode film 27 are stacked in that order from below (bit line side) to above (word line side). The lower electrode film 21 contacts the bit line BL, and the upper electrode film 27 contacts the word line WL. Also, in the silicon diode film 22, the $p^+$-type layer $22p$, the $n^-$-type layer $22i$, and the $n^+$-type layer $22n$ are stacked in that order from the bottom layer side.

As a result in the silicon diode film 22 of the pillar 16b, a direction from the bit line BL towards the word line WL is a forward direction, and a direction from the word line WL towards the bit line BL is a reverse direction. In this way, the stacking structure of the pillar 16b is the same as the stacking structure of the pillar 16a except that the stacking order of the $n^+$-type layer $22n$, the $n^-$-type layer $22i$, and the $p^+$-type layer $22p$ in the silicon diode film 22 is reversed.

Also, in the pillar 16a, a step is formed between the part above the $p^+$-type layer $22p$, in other words, the part that includes the $p^+$-type layer $22p$, the intermediate electrode film 23, the barrier metal 24, the variable resistance film 25, the barrier metal 26, and the upper electrode film 27 (hereafter referred to as an "upper part of the pillar 16a") and the other part of the pillar 16a, in other words the part that includes the lower electrode film 21, the $n^+$-type layer $22n$, and the $n^-$-type layer $22i$ (hereafter referred to as a "lower part of the pillar 16a"), which sandwiches the step, and the upper part of the pillar 16a, is narrower than the lower part. The positional relationship between the step and an interface between the $n^-$-type layer $22i$ and the $p^+$-type layer $22p$ does not have to be so strict, as long as at least the step is located above the $n^+$-type layer $22n$. For example, an upper part of the $n^-$-type layer $22i$ may be included in the upper part of the pillar 16a. Also, in FIG. 2 and elsewhere, an example is illustrated in which the thickness of the pillar 16 is constant in the vertical direction, but this is not a limitation, for example, the shape of the pillar 16 may have the shape of a frustum in which the lower part is wider than the upper part.

Also, an insulating fixed charge film 18a is provided on a side face of the upper part of the pillar 16a, as a charge bearing member that contains a negative fixed charge. The fixed charge film 18a is formed from an insulating material having a negative fixed charge, such as, for example, alumina ($Al_2O_3$) or hafnium oxide ($HfO_2$) or the like. The fixed charge film 18a includes, for example, a sheet concentration of not less than $1 \times 10^{13}$ $cm^{-2}$ negative fixed charge, for example, electrons or negative ions. The fixed charge film 18a covers the side faces of the upper part of the pillar 16a, but does not cover side faces of the lower part. In other words, the fixed charge film 18a covers a portion of the side faces of the pillar 16a that is distant from the silicon substrate 11, and is disposed on side faces of the $p^+$-type layer $22p$, and is not disposed on side faces of the $n^+$-type layer $22n$. The fixed charge film 18a covers a periphery of the upper part of the pillar 16a, the film thickness thereof is substantially uniform, and approximately equal to the height of the step between the upper part and lower part of the pillar 16a.

On the other hand, in the pillar 16b, a step is formed between the part above the $n^+$-type layer $22n$, in other words, the part that includes the $n^+$-type layer $22n$, the intermediate electrode film 23, the barrier metal 24, the variable resistance film 25, the barrier metal 26, and the upper electrode film 27 (hereafter referred to as an "upper part of the pillar 16b") and the other part of the pillar 16b, in other words the part that includes the lower electrode film 21, the $p^+$-type layer $22p$, and the $n^-$-type layer $22i$ (hereafter referred to as a "lower part of the pillar 16b"), which sandwiches the step, and the upper part of the pillar 16b is narrower than the lower part. The positional relationship between the step and the interface between the $n^-$-type layer $22i$ and the $n^+$-type layer $22n$ does not have to be so strict, as long as at least the step is located above the $p^+$-type layer $22p$. For example, the upper part of the $n^-$-type layer $22i$ may be included in the upper part of the pillar 16b.

Also, a fixed charge film 18b is provided on a side face of the upper part of the pillar 16b, as a charge bearing member that contains positive fixed charge. The fixed charge film 18b is formed from an insulating material having a positive fixed charge, such as, for example, silicon nitride ($Si_3N_4$) or the like. The fixed charge film 18b includes, for example, a sheet concentration of not less than $1 \times 10^{13}$ $cm^{-2}$ positive fixed charge, for example, positive ions. The fixed charge film 18b covers the side faces of the upper part of the pillar 16b, but does not cover the side faces of the lower part. In other words, the fixed charge film 18b covers a portion of the side faces of the pillar 16b that is distant from the silicon substrate 11, and in more detail is disposed on the side faces of the n$^+$-type layer 22n, and is not disposed on the side faces of the p$^+$-type layer 22p. The fixed charge film 18b covers a periphery of the upper part of the pillar 16b, the film thickness thereof is substantially uniform, and approximately equal to the height of the step between the upper part and lower part of the pillar 16b.

An insulating pillar protective film 19 is provided on all the side faces of the pillars 16a and 16b, as well as all the virtual plane faces including a top face of the word line WL and all the virtual plane faces including a top face of the bit line BL. The pillar protective film 19 is, for example, a single layer silicon nitride film, or a stacked film that includes a silicon nitride layer and a silicon oxide layer. Also, the word line WL, the bit line BL, the pillars 16a and 16b, the fixed charge films 18a and 18b, and the pillar protective film 19 are embedded in the inter-layer insulating film 12.

Next, a manufacturing method of the nonvolatile memory device according to the embodiment will be described.

FIGS. 3 through 10 are process cross-sectional views illustrating the method for manufacturing the nonvolatile memory device according to the embodiment.

First, as illustrated on FIG. 1, the drive circuit for driving the memory cell unit 13 is formed on the top face of the silicon substrate 11. Next, the inter-layer insulating film 12 is formed on the silicon substrate 11. Next, a contact that extends to the drive circuit is formed in the inter-layer insulating film 12.

Figure 3:
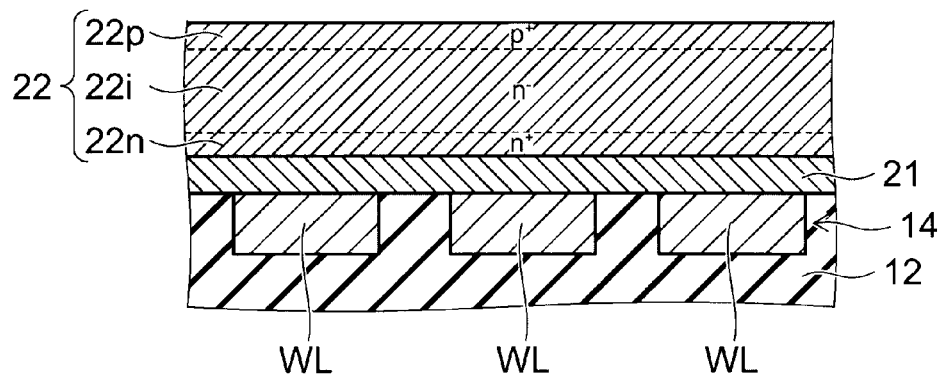
FIGS. 3 through 10 are process cross-sectional views illustrating a method for manufacturing the nonvolatile memory device according to the first embodiment.

Next, as illustrated in FIG. 3, tungsten is embedded in a top layer portion of the inter-layer insulating film 12 using, for example, a damascene method, and a plurality of word lines WL are formed so as to extend parallel to each other in the word line direction. The word line interconnect layer 14 is formed by these word lines WL. Next, titanium nitride (TiN) is deposited to a thickness of, for example, approximately 5 to 10 nm on the word line interconnect layer 14 to form the lower electrode film 21. The lower electrode film 21 is a barrier film for reducing the reaction between tungsten that forms the word line WL and silicon that forms the silicon diode film 22. The lower electrode film 21 may be formed from, for example, tantalum nitride (TaN) or tungsten nitride (WN).

Next, amorphous silicon is deposited on the lower electrode film 21. At this time, each of the impurities is introduced while depositing the amorphous silicon, to continuously form the n$^+$-type layer 22n, the n$^-$-type layer 22i, and the p$^+$-type layer 22p. In other words, while depositing the amorphous silicon, impurities that will become donors in the silicon, for example phosphorus (P), are introduced to form the n$^+$-type layer 22n, and by depositing amorphous silicon without introducing impurities the n$^-$-type layer 22i is formed, and while depositing the amorphous silicon, impurities that will become acceptors in the silicon, for example boron (B), are introduced to form the p$^+$-type layer. In this way, the pin type silicon diode film 22 is formed. In one example, the film thickness of the n$^+$-type layer 22n is 2 to 15 nm and the phosphorus concentration is $1\times10^{20}$ to $1\times10^{21}$ cm$^{-3}$, the film thickness of the n$^-$-type layer 22i is 50 to 120 nm, and the film thickness of the p$^+$-type layer 22p is 2 to 15 nm and the boron concentration is $1\times10^{20}$ to $2\times10^{21}$ cm$^{-3}$.

Figure 4:
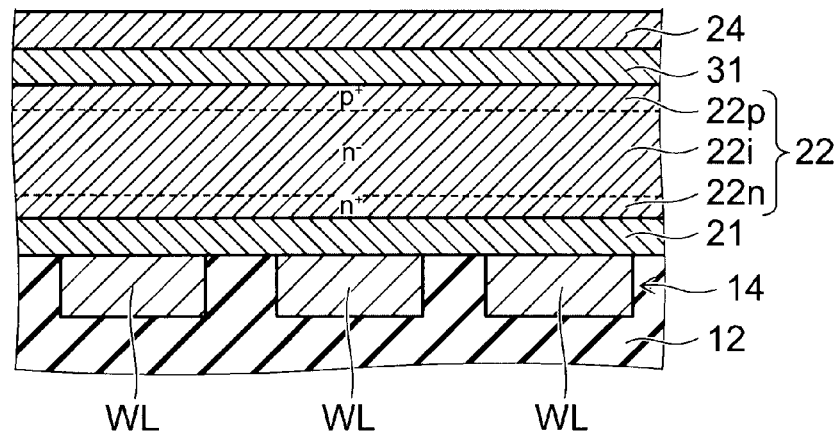

Next, as illustrated in FIG. 4, a metal layer 31 is formed on the silicon diode film 22. The metal layer 31 is formed to achieve ohmic contact by forming silicide between the silicon diode film 22. The material of the metal layer 31 is preferably a metal for which the absolute value of the reduction in Gibbs free energy or generated heat when forming an oxide is larger than that of silicon. In this way the natural oxidation film formed on the top face of the silicon diode film 22 can be deoxidized. Also, preferably the material of the metal layer 31 is a metal whose melting point is sufficiently high that the silicide formed does not agglomerate due to the subsequent annealing. The material of the metal layer 31 is, for example, preferably titanium (Ti), tantalum (Ta), niobium (Nb), hafnium (Hf), zirconium (Zr), or chromium (Cr), or an alloy of these metals with tungsten (W), for example, titanium is preferable. The thickness of the metal layer 31 is, for example, 0.5 to 5 nm.

Next, the barrier metal 24 is formed on the metal layer 31. The barrier metal 24 is preferably formed from titanium nitride (TiN) from the point of view of the ability to prevent diffusion and the switching performance with the subsequently formed variable resistance film 25 (see FIG. 2). The thickness of the barrier metal 24 is, for example, 10 nm.

Figure 5:
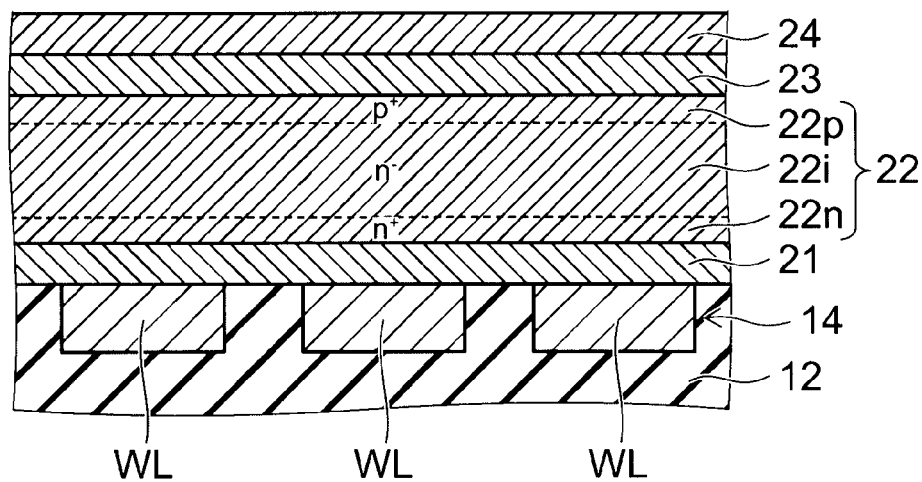

Next, as illustrated in FIG. 5, annealing (silicide annealing) is carried out. For example, the annealing temperature is 500 to 700° C. In this way, silicon in the silicon diode 22 diffuses into the metal layer 31 (see FIG. 4), reacts with the titanium that forms the metal layer 31, forming the intermediate electrode film 23 made from titanium silicide ($TiSi_2$). At this time, the barrier metal 24 made from titanium nitride (TiN) remains virtually as it is.

Figure 6:
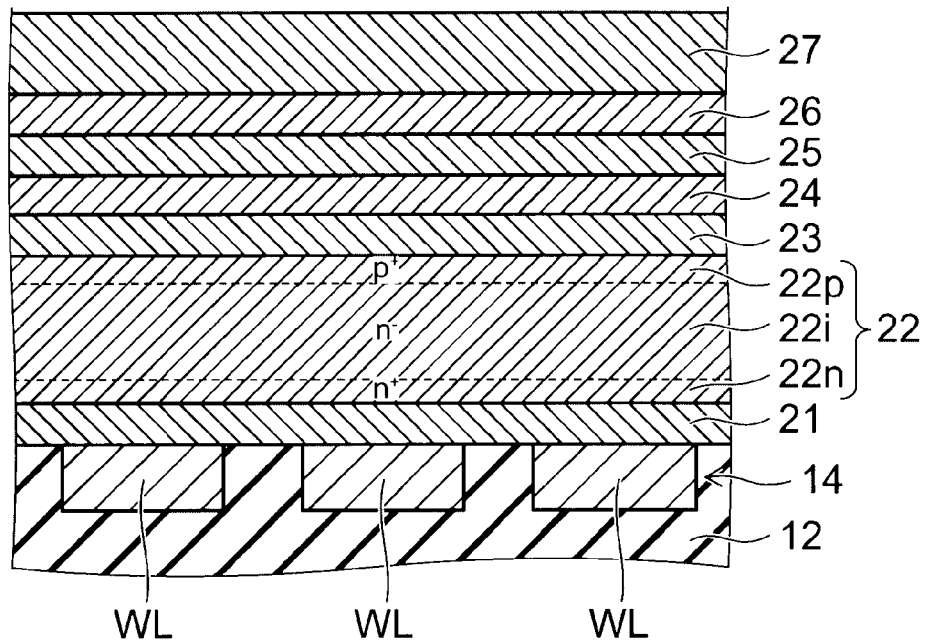

Next, as illustrated in FIG. 6, the variable resistance film 25 made from, for example, a metal oxide, is formed on the barrier metal 24. Next, the barrier metal 26 made from, for example, titanium nitride (TiN) is formed. Next the upper electrode film 27 made from, for example, tungsten is formed. The film thickness of the upper electrode film 27 is, for example, 50 to 150 nm.

Figure 7:
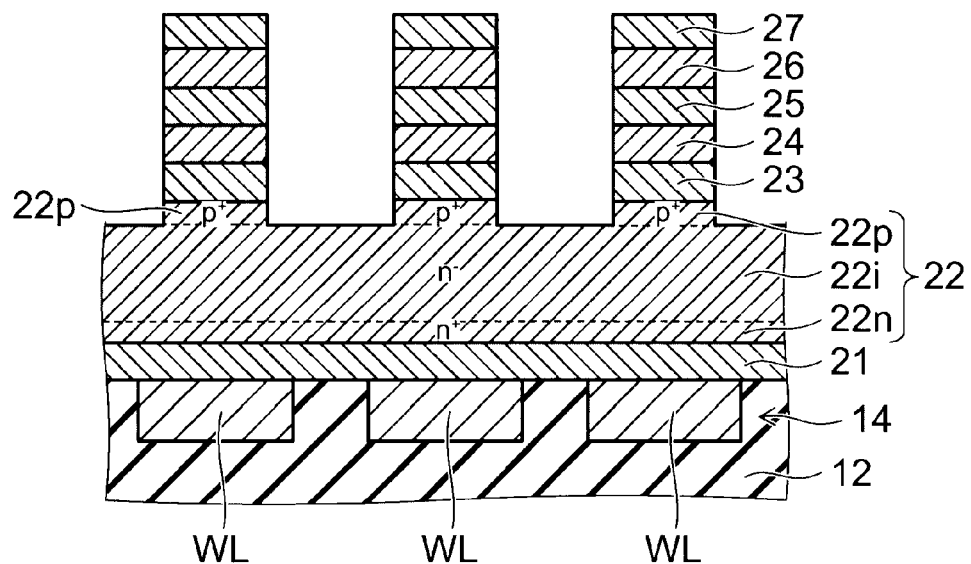

Next, as illustrated in FIG. 7, a silicon oxide film using tetra ethyl ortho silicate (TEOS) as the raw material and a silicon nitride film are formed to form the mask material for mask patterning, and this mask material is patterned using the lithography method to form a mask pattern (not illustrated on the drawings). Next, reactive ion etching (RIE) is carried out using the mask pattern as the mask, and the upper electrode film 27, the barrier metal 26, the variable resistance film 25, the barrier metal 24, the intermediate electrode film 23, and the p$^+$-type layer 22p of the silicon diode film 22 are selectively removed, and segmentalized along the word line direction and the bit line direction. At this time the n$^-$-type layer 22i and the n$^+$-type layer 22n of the silicon diode film 22 and the lower electrode film 21 are not segmentalized. In this way the upper part of the pillar 16a (see FIG. 2) is formed.

Figure 8:
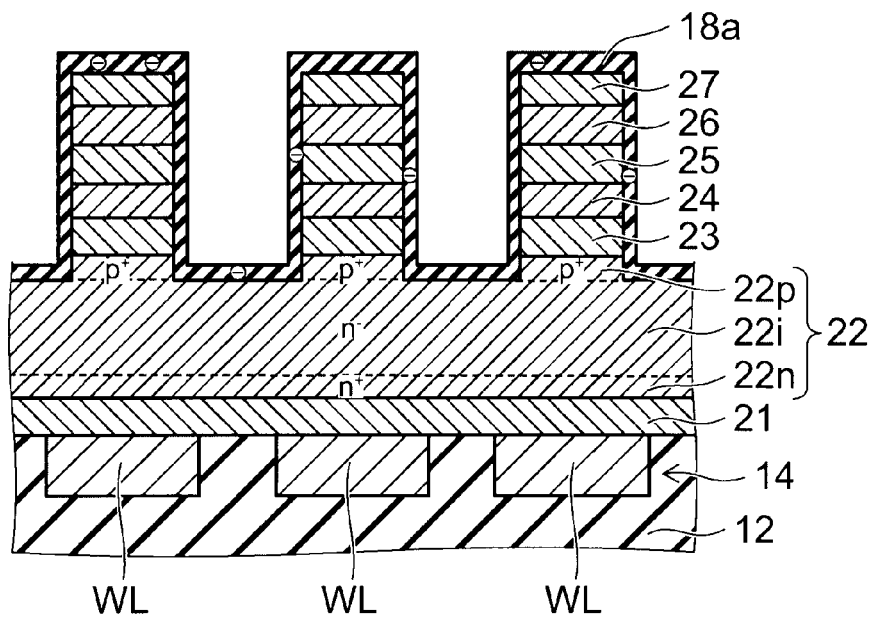

Next, as illustrated in FIG. 8, the fixed charge film 18a that contains a negative fixed charge is formed on all faces. The fixed charge film 18a is formed from an insulating material having a negative fixed charge, such as, for example, alumina ($Al_2O_3$) or hafnium oxide ($HfO_2$) or the like. There is no limitation on the method for forming the fixed charge film 18a, for example, the chemical vapor deposition (CVD) method, the physical vapor deposition (PVD) method, the atomic layer deposition (ALD) method, or the plasma enhanced atomic layer deposition (PeALD) method can be used. At this time, it is possible to adjust the quantity of fixed charge contained in the fixed charge film 18a by controlling the material, the film thickness, and the film quality of the fixed charge film 18a.

Figure 9:
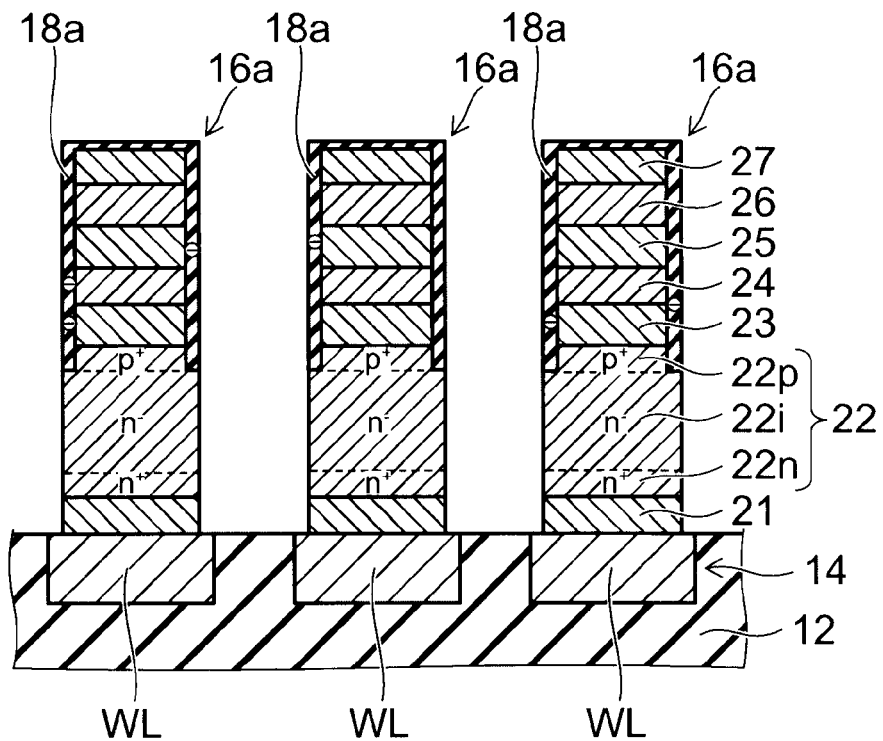

Next, as illustrated in FIG. 9, RIE is carried out, and the fixed charge film 18a formed on the n$^-$-type layer 22i, the n$^-$-type layer 22i, the n$^+$-type layer 22n, and the lower electrode film 21 are selectively removed, and segmentalized along both the word line direction and the bit line direction. In this way, the plurality of pillars 16a is formed on each word line WL. At this time, the fixed charge film 18a remains on the side faces of the upper part of the pillars 16a. Also, the step is formed at the interface between the upper part and the lower part of the pillar 16a corresponding to the film thickness of the fixed charge film 18a.

Figure 10:
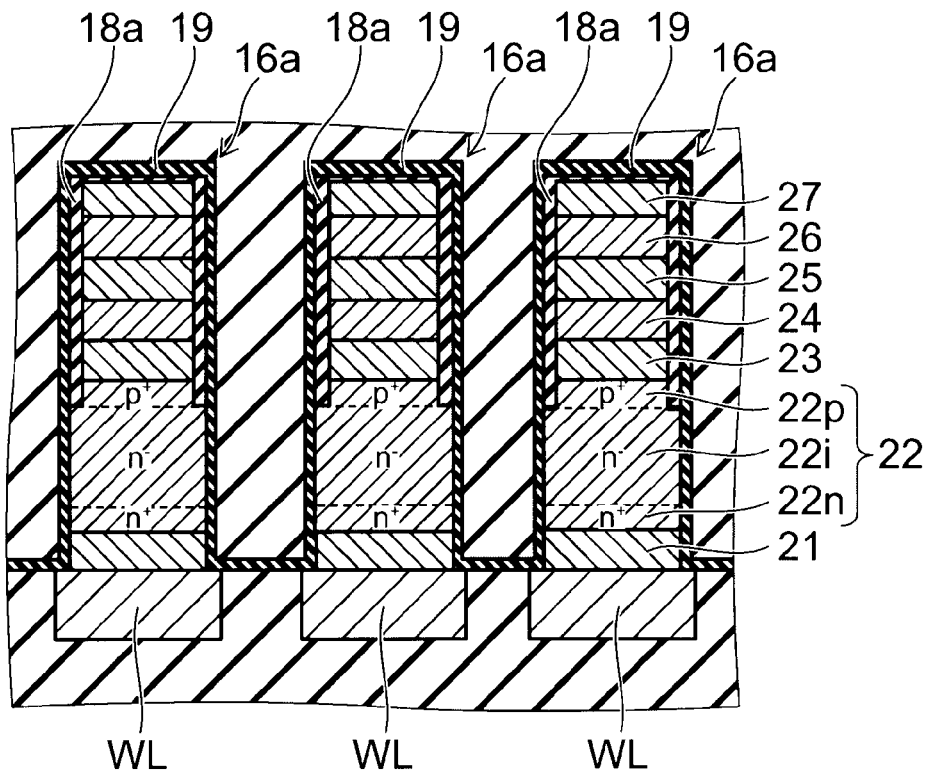

Next, as illustrated in FIG. 10, the pillar protective film 19 is formed using for example the CVD method or the ALD method, on the top face and side faces of the pillars 16a, and on the exposed faces of the inter-layer insulating film 12, by depositing a single layer silicon nitride film, or a stacked film that includes a silicon nitride layer and a silicon oxide layer. Next, the inter-layer insulating film 12 is deposited, embedding the pillar protective film 19 and fixed charge film 18a, as well as the pillars 16a. The pillar protective film 19 is formed to protect the pillars 16 from the inter-layer insulating film 12. In other words, if the inter-layer insulating film 12 has moisture-absorption properties, in the annealing after forming the pillars 16, the inter-layer insulating film 12 acts as an oxidizing agent, so the silicon diode film 22 and the variable resistance film 25 could be damaged and the characteristics of the memory cells could be degraded, but by providing the pillar protective film 19, this possibility can be eliminated. However, if this possibility is small, the pillar protective film 19 can be omitted.

Next, as illustrated in FIG. 2, a chemical mechanical polishing (CMP) process is carried out so that the upper electrode film 27 will become a stopper with respect to the top face of the inter-layer insulating film 12. In this way, the inter-layer insulating film 12 and the pillar protective film 19 are removed from the pillar 16a, and the top face of the inter-layer insulating film 12 is flattened. Also, the upper electrode film 27 is exposed at the top face of the inter-layer insulating film 12.

Next, a further inter-layer insulating film is formed on the inter-layer insulating film 12, and the bit lines BL are formed using a damascene method. The bit lines BL are formed, for example, from tungsten. The bit line interconnect layer 15 is formed using a plurality of bit lines BL. Each bit line BL is connected to the top faces of the plurality of pillars 16a arranged in the bit line direction. As a result, each of the pillars 16a is formed between the word line WL and the bit line BL, and is connected to the word line WL and the bit line BL.

Next, the pillars 16b are formed on the bit lines BL. The method for forming the pillars 16b is the same as the method for forming the pillars 16a, but points of difference are that the order of stacking the $n^+$-type layer $22n$, the $n^-$-type layer $22i$, and the $p^+$-type layer $22p$ in the silicon diode 22 is reversed, and the fixed charge film 18b that includes positive fixed charge is formed on the side faces of the upper part of the pillars 16b.

In other words, when forming the silicon diode film 22, the $p^+$-type layer $22p$, the $n^-$-type layer $22i$, and the $n^+$-type layer $22n$ are deposited in that order. Also, when processing the upper part of the pillar 16b, the upper electrode film 27, the barrier metal 26, the variable resistance film 25, the barrier metal 24, the intermediate electrode film 23, and the $n^+$-type layer $22n$ of the silicon diode film 22 are selectively removed, and the $n^-$-type layer $22i$ and the $p^+$-type layer $22p$ of the silicon diode film 22, and the lower electrode film 21 are not segmentalized.

Then, after processing the upper part of the pillars 16b, the fixed charge film 18b that contains positive fixed charge is deposited. The fixed charge film 18b is formed from an insulating material having a positive fixed charge, such as, for example, silicon nitride ($Si_3N_4$) or the like. There is no particular limitation on the method of forming the fixed charge film 18b, for example the CVD method, the PVD method, the ALD method, or the PeALD method can be used. Also, it is possible to adjust the quantity of fixed charge contained in the fixed charge film 18b by controlling the material, the film thickness, and the film quality of the fixed charge film 18b. In this way, the pillars 16b are formed, and the fixed charge film 18b that contains positive fixed charge is formed on the side faces of the upper part of the pillars 16b. Next, the inter-layer insulating film 12 is filled in between the pillars 16b, the upper face is flattened, and the top face of the pillars 16b is exposed.

Thereafter, by the same method, the word line interconnect layers 14, the pillars 16a, the fixed charge films 18a, the bit line interconnect layers 15, the pillars 16b, and the fixed charge films 18b are repeatedly formed. Then, activation annealing is carried out at a temperature of, for example, 700 to 900° C., for about 3 to 80 seconds, for example, in order to crystallize the silicon diode film 22. In this way, the nonvolatile memory device 1 according to the embodiment is manufactured.

Next, the effect of the embodiment will be described.

Figure 11:
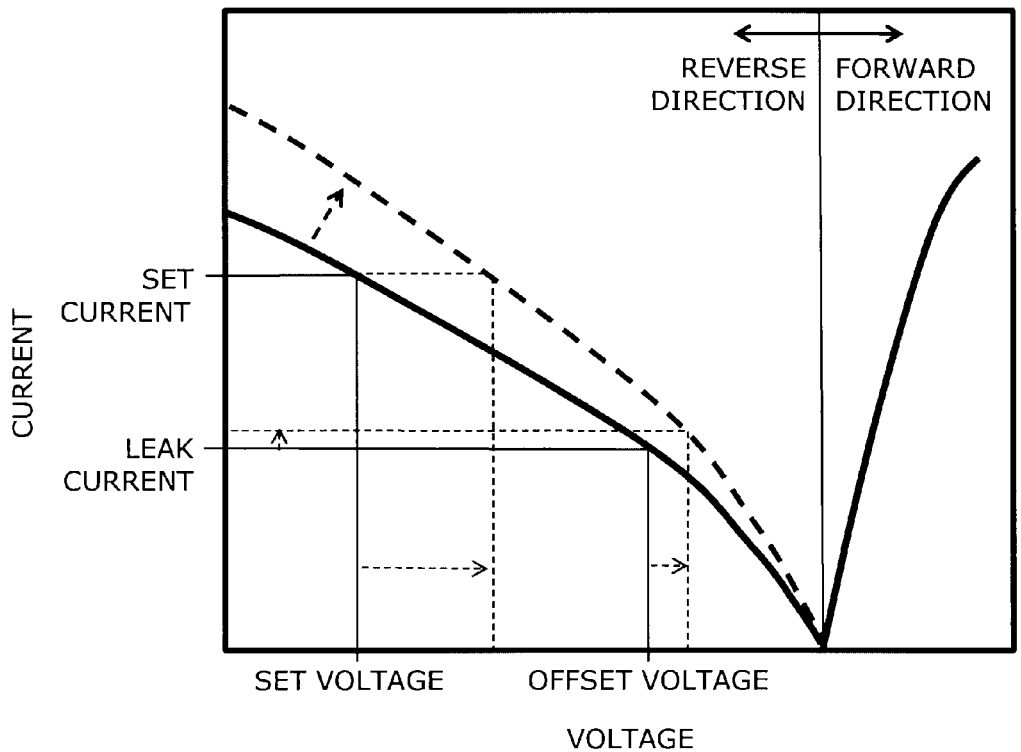
FIG. 11 is a graph schematically illustrating the I-V characteristic of a diode provided in a ReRAM.
Figure 12:
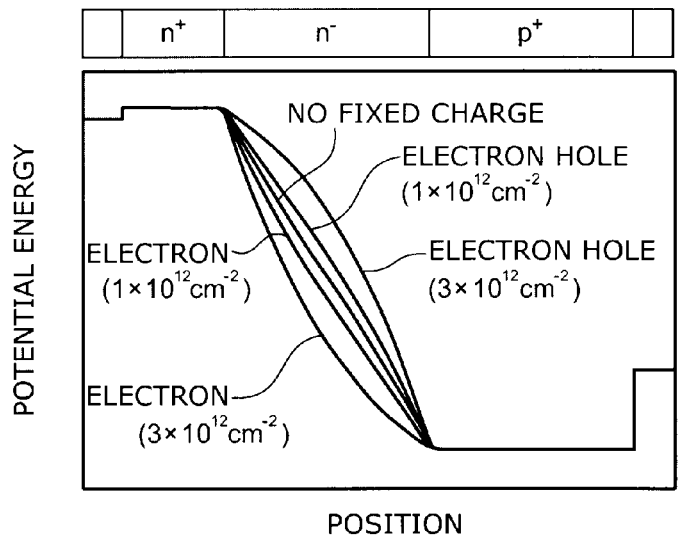
FIG. 12 is a graph illustrating the distribution of potential energy of a pin type diode.
Figure 13A:
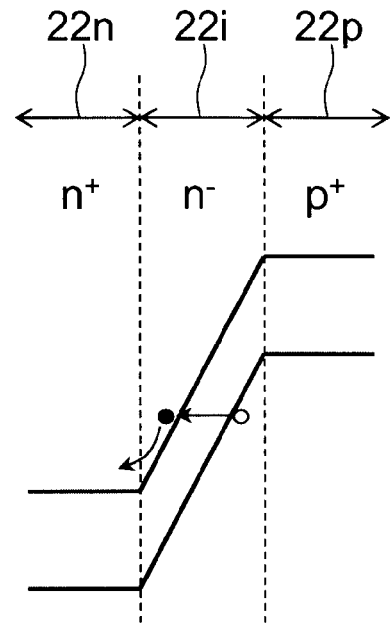
FIGS. 13A through 13C are band diagrams for pin type diodes.
Figure 13B:
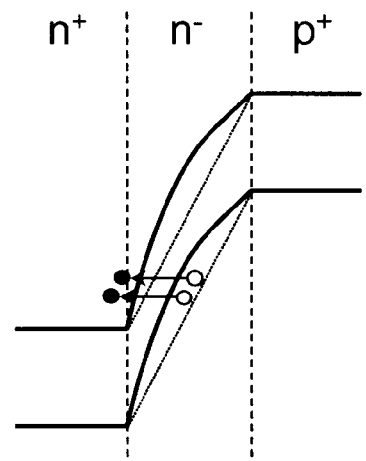
Figure 13C:
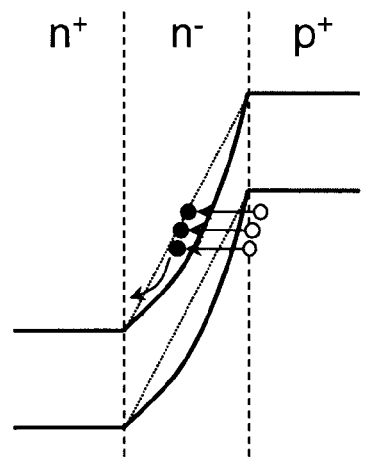
Figure 14A:
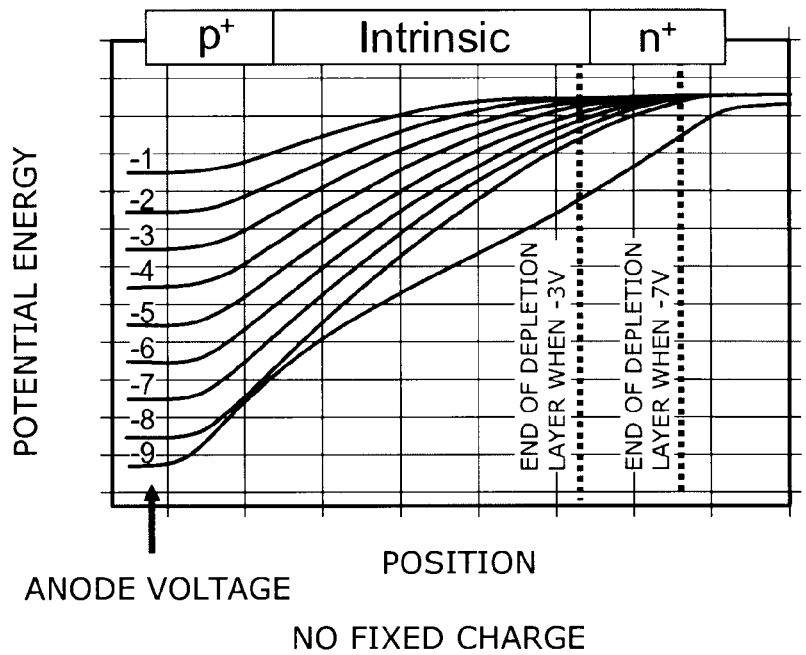
FIGS. 14A and 14B are graphs showing the simulation results for potential distribution of a pin type diode.
Figure 14B:
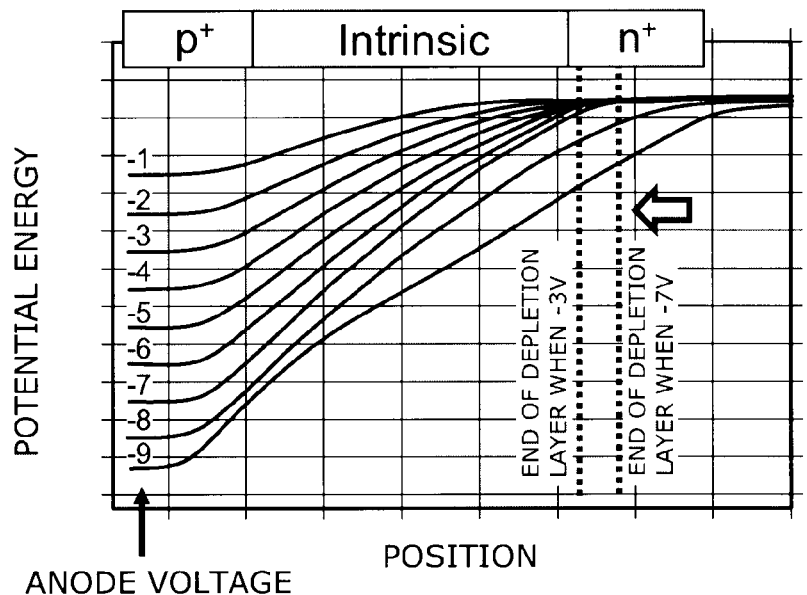
Figure 15A:
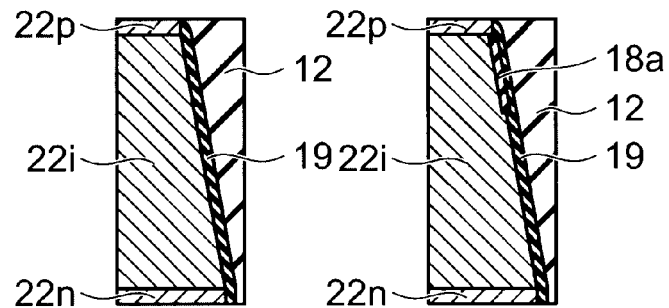
FIG. 15A is a cross-sectional view illustrating pillars.
Figure 15B:
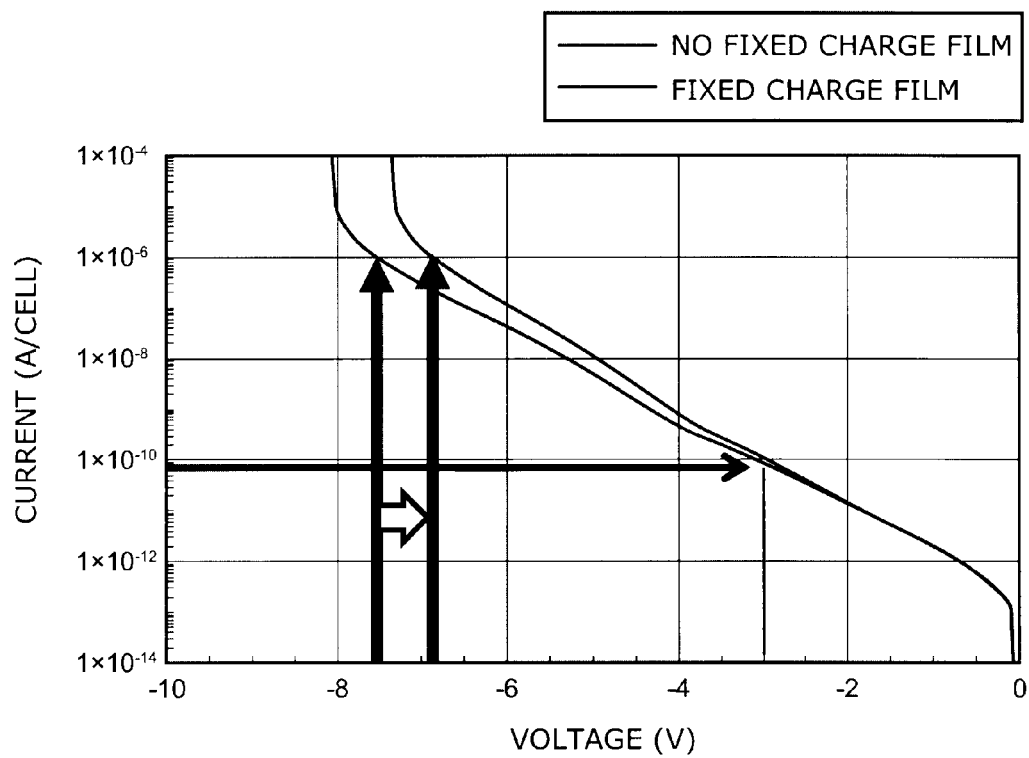
FIG. 15B is a graph illustrating the simulated results for the I-V characteristics for the pillars shown in FIG. 15A.

FIG. 11 is a graph schematically illustrating the I-V characteristic of a diode provided in a ReRAM, with voltage on the horizontal axis, and current on the vertical axis, FIG. 12 is a graph illustrating the distribution of potential energy of a pin type diode, with position on the horizontal axis and electron potential energy on the vertical axis, FIGS. 13A through 13C are band diagrams for pin type diodes, FIG. 13A shows the case where fixed charge is not provided, FIG. 13B shows the case where a negative fixed charge is provided on the anode side, and FIG. 13C shows the case where positive fixed charge is provided on the cathode side, FIGS. 14A and 14B are graphs showing the simulation results for potential distribution of a pin type diode, with position on the horizontal axis and potential energy on the vertical axis, FIG. 14A shows the case where fixed charge is not provided, and FIG. 14B shows the case where positive fixed charge is provided at the interface between the $n^+$-type layer and the i-type layer, and FIG. 15A is a cross-sectional view illustrating pillars, and FIG. 15B is a graph showing the simulated results for the I-V characteristics for the pillars shown in FIG. 15A.

In the nonvolatile memory device 1 according to the embodiment, the silicon diode film 22 provided on each pillar 16 is used as a selection element for current to flow to the selected pillar 16 only. In order to reduce the withstand voltage required for the nonvolatile memory device 1, the silicon diode film 22 is driven bipolarly, with the set voltage and the reset voltage having mutually opposite polarity. In this case, in the set operation, the silicon diode film 22 is used in the reverse direction region.

In other words, as shown in FIG. 11, the pillar 16, to which the variable resistance film 25 that is to be executed in the set operation belongs, is selected and a set voltage in the reverse direction is applied to this pillar 16. In this way, a predetermined set current flows in this pillar 16, and the resistance state of the variable resistance film 25 switches from the high resistance state to the low resistance state. On the other hand, the pillars 16, to which the variable resistance films 25 that are not to operated in the set operation belong, are not selected, but an offset voltage in the reverse direction is unavoidably applied to the unselected pillars 16. The absolute value of the offset voltage is smaller than the absolute value of the set voltage, but a certain amount of current flows in the pillars 16, depending on the characteristics of the diode. This current is leak current.

In order to execute the set operation, it is necessary for a predetermined set current to flow in the variable resistance film 25. The magnitude of the set current is determined by the characteristics of the variable resistance film 25. Also, in order for the set current to flow in the variable resistance film 25, it is necessary that a predetermined set voltage be applied to the pillar to which the variable resistance film 25 belongs. The magnitude of the set voltage is determined mainly by the reverse direction characteristics of the silicon diode film 22. Also, it is desirable to keep the set voltage as low as possible, mainly due to restrictions of the drive circuit. On the other hand, in order to reduce the power consumption of the whole nonvolatile memory device 1, it is desirable to make the leak current as small as possible. Therefore, what is required of the silicon diode film 22 is as low a set voltage as possible for the set current to flow, and a characteristic with a small leak current.

If the silicon diode film 22 is made thinner, the depletion layer becomes thinner, so the current that flows when an arbitrary voltage is applied increases, as shown by the broken line in FIG. 11. Therefore, it is possible to reduce the set voltage, but at the same time the leak current increases. For example, if the thickness of the silicon diode film 22 is reduced from 85 nm to about 60 nm, the set voltage is reduced by about 1.5 V, but the leak current increases by a factor of about 10. When the leak current increases, the number of pillars 16 that can be formed in the nonvolatile memory device reduces, as a result of restrictions on power consumption, so the degree of integration of the memory cells reduces. Therefore, it is difficult to simply make the silicon diode film 22 thinner. Therefore, in the embodiment, by providing the fixed charge films 18a or 18b that contain fixed charge (hereafter collectively referred to as the "fixed charge film 18") near the silicon diode film 22, the balance between the set voltage and the leak current is improved.

As shown in FIG. 12, when fixed charge is not provided, the potential energy in the pin type diode is almost constant in the $p^+$-type layer and the $n^+$-type layer which have high carrier density, and in the $n^-$ type layer (or the i-type layer) with low carrier density, it varies linearly between the $p^+$-type layer and the $n^+$-type layer. In contrast, when a negative fixed charge, for example electrons, is provided on the anode side, in other words near the $p^+$-type layer, the potential energy of the $n^-$-type layer is reduced overall, so the line that represents the potential energy becomes curved so that it is convex on the low energy side. Also, when positive fixed charge, for example electron holes, is provided on the cathode side, in other words near the $n^+$-type layer, the potential energy of the $n^-$-type layer is raised as a whole, so the line that represents the potential energy becomes curved so that it is convex on the high energy side.

If this is represented on a band diagram, the diagrams as shown in FIGS. 13A through 13C are obtained. In other words, relative to the state in which fixed charge is not provided as shown in FIG. 13A as standard, when a negative fixed charge is disposed adjacent to the $p^+$-type layer as shown in FIG. 13B, the potential energy is increased with respect to electrons, so the band diagram is curved convex upwards. As a result, the electric field strength in the $n^-$-type layer near the $p^+$-type layer is increased, so carriers can move more easily. On the other hand, as shown in FIG. 13C, when positive fixed charge is disposed adjacent to the $n^+$-type layer, the potential energy is reduced with respect to electrons, so the band diagram is curved convex downwards. As a result, the electric field strength in the $n^-$-type layer near the $n^+$-type layer is increased, so carriers can move more easily.

Also, as shown in FIG. 14A, the distribution of potential energy within a pin type diode varies depending on the anode voltage applied. According to the investigations of the inventors, the variation in the distribution of potential energy due to the fixed charge also depends on the anode voltage, as shown in FIGS. 14A and 14B. At this time, the form of the variation in the potential energy distribution due to the anode voltage is different.

In the potential energy distributions shown in FIGS. 14A and 14B, the part where the distribution curve is inclined is the part where the depletion layer is formed. The simulation shown in FIGS. 14A and 14B assumes the case in which positive fixed charge is disposed at the interface between the $n^+$-type layer and the i-type layer. When the anode voltage is 3 V, the end of the depletion layer has almost no movement even when fixed charge is disposed. In contrast, when the anode voltage is 7 V, the depletion layer becomes shorter when fixed charge is disposed, and the position of the end of the depletion layer on the $n^+$-type layer side moves greatly towards the i-type layer side.

As a result, the I-V characteristic of the pin-type diode varies as follows. FIGS. 15A and 15B show other simulation results. In this simulation, as shown in FIG. 15A, the shape of the silicon diode film 22 part in the pillar 16 was a frustum of a circular cone in which the lower end is wider than the upper end, and the taper angle was assumed to be 10 degrees. Also, simulations were carried out for the I-V characteristics assuming the case in which the fixed charge film 18a having a negative fixed charge is provided in the part on the $p^+$-type layer 22p side of the $n^-$-type layer 22i, as illustrated in the right side of FIG. 15A, and the case in which the fixed charge film 18a is not provided, as illustrated in the left side of FIG. 15A. As shown in FIG. 15B, the results showed that when the fixed charge film 18a was provided, the voltage at which breakdown occurs is reduced compared with the case where the fixed charge film 18a is not provided, and in particular in the region where the absolute value of the voltage is high, the current is increased.

In this way it is possible to reduce the set voltage in order for a predetermined current to flow in the silicon diode film 22. For example, if the set current per memory cell is $1 \times 10^{-6}$ (Amperes), by providing the fixed charge film 18a, the absolute value of the set voltage can be reduced from about 7.5 V (volts) to 6.9 V. On the other hand, when the absolute value of the voltage applied to the unselected pillars is 3 V, the leak current is virtually unchanged even if the fixed charge film 18a is provided. In this way, according to the embodiment, by providing the fixed charge film 18a, it is possible to reduce the set voltage while minimizing the increase in the leak current. Assuming the fixed charge film 18a is provided on all faces of the side faces of the silicon diode film 22, the depletion layer will shorten when the anode voltage is 3 V, and the leak current will increase.

Also, according to the embodiment, it is possible to adjust the quantity of fixed charge contained in the fixed charge film 18 by controlling the material, the film thickness, and the film quality of the fixed charge film 18. As a result it is possible to adjust the I-V characteristic of the silicon diode film 22, and control the set voltage.

In addition, according to the embodiment, in the process illustrated in FIG. 7, the upper part of the pillar 16a is processed, and in the process illustrated in FIG. 8, the fixed charge film 18a that contains a negative fixed charge is formed on the side faces of the upper part of the pillars 16a, and in the process illustrated in FIG. 9, the lower part of the pillar 16a is also processed. In this way, the fixed charge film 18a that contains a negative fixed charge is disposed only near the top layer portion of the silicon diode film 22, namely the p$^+$-type layer 22p, and is not disposed near the bottom layer portion of the silicon diode film 22, namely the n$^+$-type layer 22n. Likewise, for the pillars 16b, the fixed charge film 18b that contains positive fixed charge is disposed only near the top layer portion of the silicon diode film 22, namely the n$^+$-type layer 22n, and is not disposed near the bottom layer portion of the silicon diode film 22, namely the p$^+$-type layer 22p. In this way it is possible to selectively dispose the fixed charge on the anode side or the cathode side of the silicon diode film 22.

Next, a second embodiment will be described.

Figure 16:
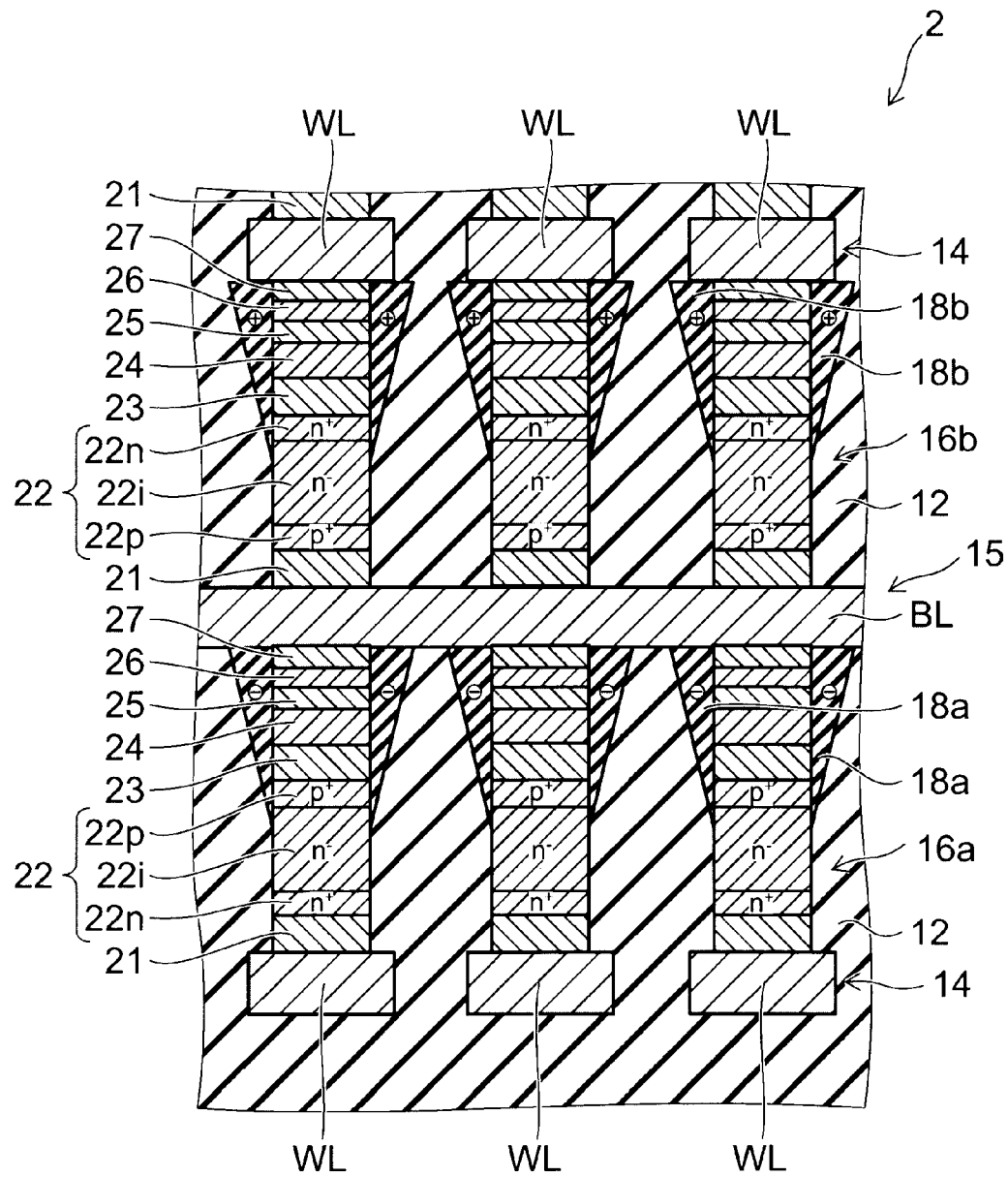
FIG. 16 is a cross-sectional view illustrating a nonvolatile memory device according to a second embodiment.

FIG. 16 is a cross-sectional view illustrating a nonvolatile memory device according to the embodiment.

As illustrated in FIG. 16, in a nonvolatile memory device 2 according to the embodiment, no step is formed between the upper part and the lower part of the pillar 16. Also, the fixed charge film 18 is only applied to the upper part of the pillar 16, but the thickness thereof increases towards the top end of the pillar 16. Also, in the nonvolatile memory device 2, the pillar protective film 19 (see FIG. 2) is not provided. The configuration of the embodiment other than that described above is the same as the first embodiment as described previously.

Next, a manufacturing method of the nonvolatile memory device according to the embodiment will be described.

Figure 17:
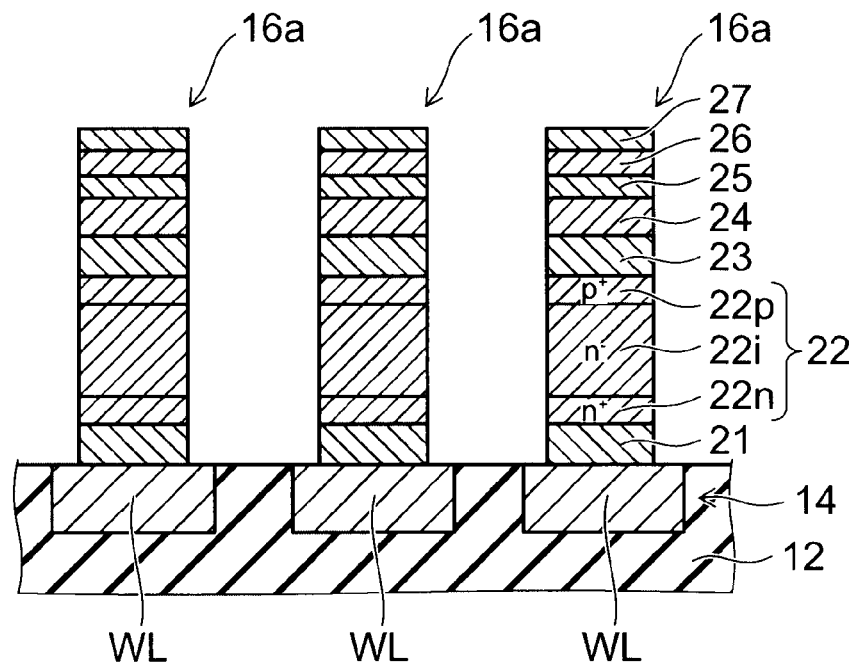
FIGS. 17 through 19 are process cross-sectional views illustrating a method for manufacturing the nonvolatile memory device according to the second embodiment.
Figure 18:
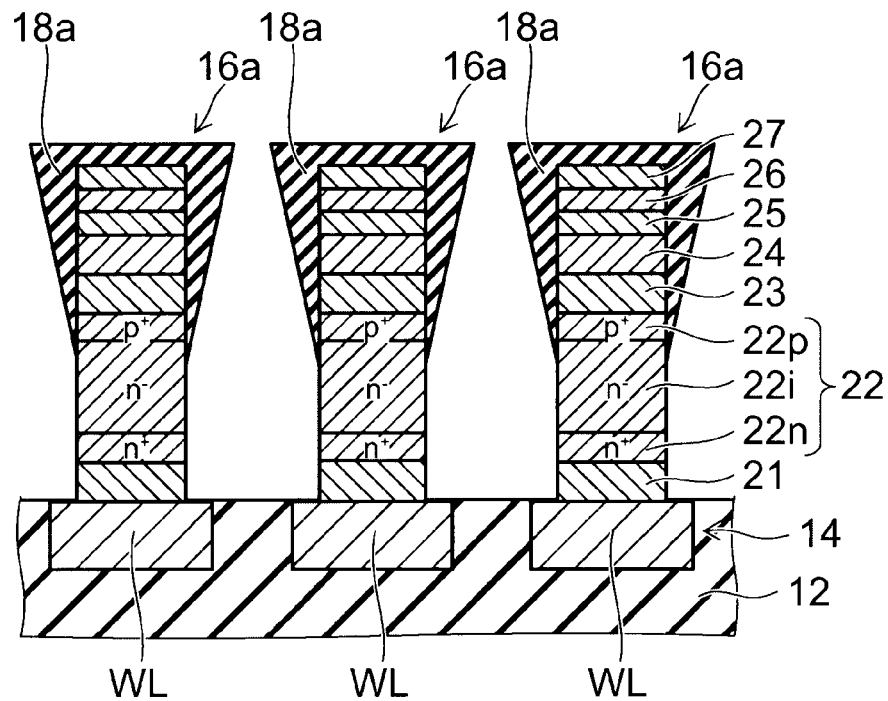
Figure 19:
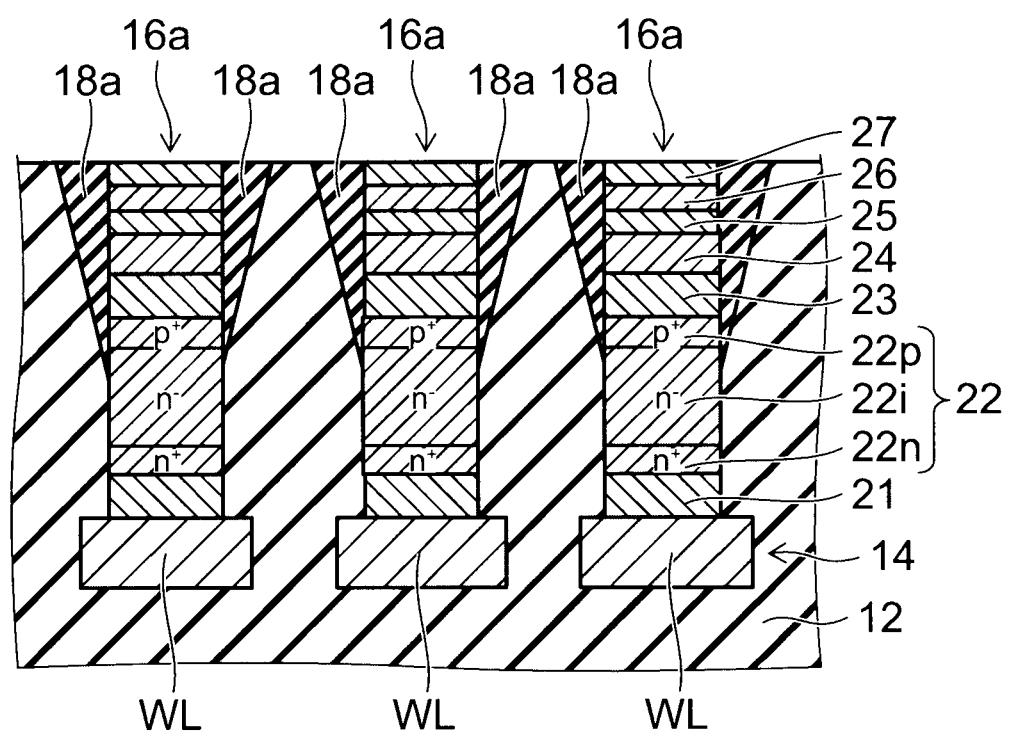

FIGS. 17 through 19 are process cross-sectional views illustrating the method for manufacturing the nonvolatile memory device according to the embodiment.

First, the processes illustrated in FIGS. 1 and 3 through 6 are carried out. In this way, the lower electrode film 21, the silicon diode film 22, the intermediate electrode film 23, the barrier metal 24, the variable resistance film 25, the barrier metal 26, and the upper electrode film 27 are deposited in that order on the word line interconnect layer 14. The processes to this point are the same as for the first embodiment as previously described.

Next, RIE is carried out using the mask pattern (not shown on the drawings) as the mask, as illustrated in FIG. 17, and the upper electrode film 27, the barrier metal 26, the variable resistance film 25, the barrier metal 24, the intermediate electrode film 23, the silicon diode film 22, and the lower electrode film 21 are selectively removed, and segmentalized along both the word line direction and the bit line direction. In this way the pillar 16a is formed.

Next, the fixed charge film 18a containing a negative fixed charge is deposited, as illustrated in FIG. 18. This deposition is carried out by a low coverage rate method, for example the PVD method or the CVD method, and covers the side faces of the upper part of the pillars 16a, in other words, the part higher than the upper part of the n$^-$-type layer 22i of the silicon diode film 22. On the other hand, the fixed charge film 18a is not applied to the side faces of the lower part of the pillars 16a, in other words, the part lower than the lower part of the n$^-$-type layer 22i.

Next, as illustrated in FIG. 19, the pillars 16a and the fixed charge film 18a are embedded in the inter-layer insulating film 12, and the top face of the inter-layer insulating film 12 is flattened.

Next, as illustrated in FIG. 16, the plurality of bit lines BL is formed, to form the bit line interconnect layer 15.

Next, the pillars 16b are formed by the same method as the pillars 16a. However, similar to the first embodiment as previously described, when forming the silicon diode film 22 of the pillars 16b, the silicon diode film 22 is deposited in the order p$^+$-type layer 22p, the n$^-$-type layer 22i, and the n$^+$-type layer 22n.

Next, the fixed charge film 18b containing positive fixed charge is deposited using a low coverage rate method. In this way, the fixed charge film 18b is applied so as to cover the side faces of the upper part of the pillars 16b. Next, the pillars 16b are embedded in the inter-layer insulating film 12, and the top face of the inter-layer insulating film 12 is flattened.

Thereafter, by the same method, the word line interconnect layers 14, the pillars 16a, the fixed charge films 18a, the bit line interconnect layers 15, the pillars 16b, and the fixed charge films 18b are repeatedly formed. Then, activation annealing is carried out in order to crystallize the silicon diode film 22. In this way, the nonvolatile memory device 2 according to the embodiment is manufactured.

The manufacturing method according to the embodiment apart from the above is the same as the first embodiment as described previously. The operation and effect of the embodiment is the same as the first embodiment as described previously.

Next, a third embodiment will be described.

Figure 20:
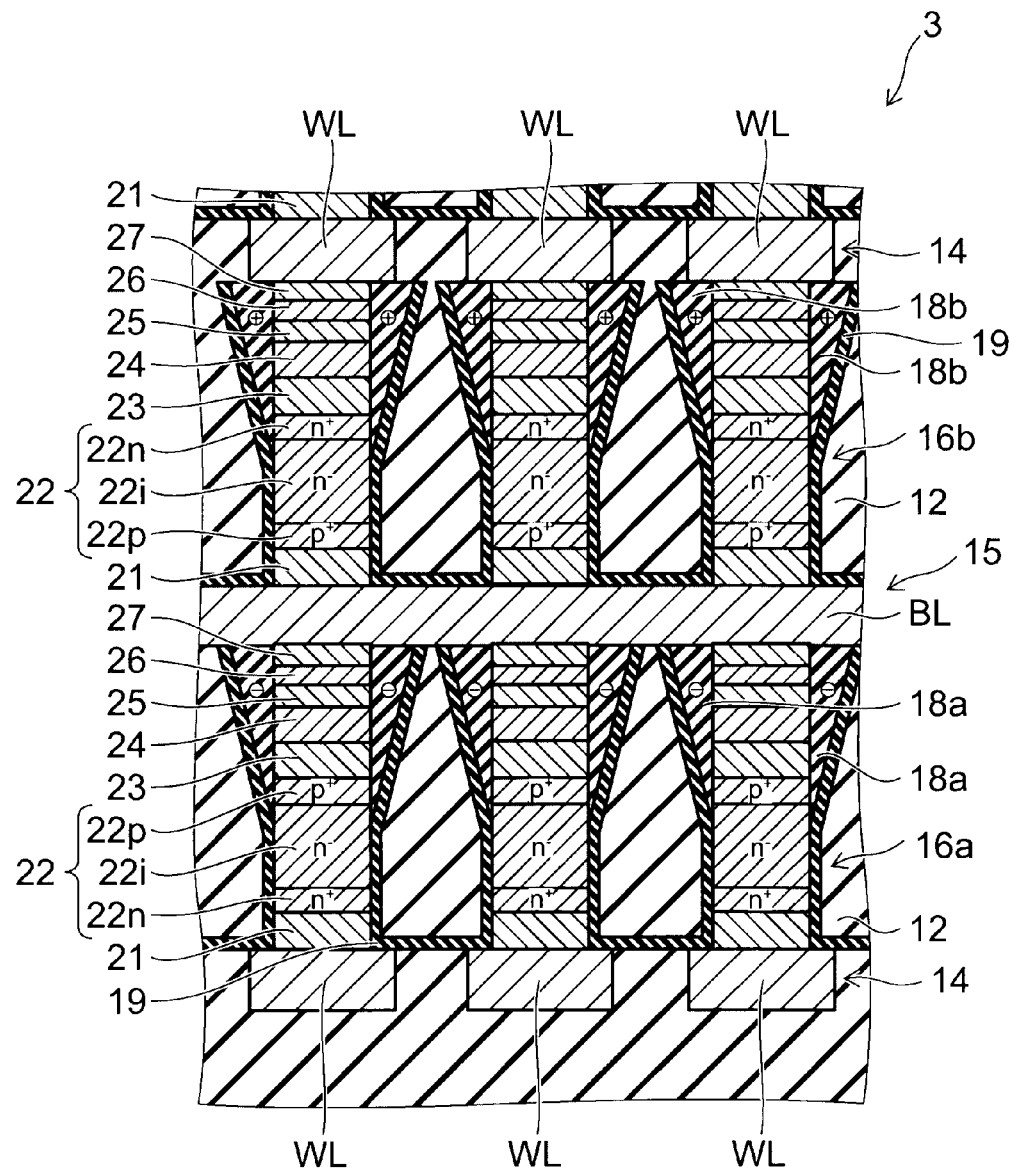
FIG. 20 is a cross-sectional view illustrating a nonvolatile memory device according to a third embodiment.

FIG. 20 is a cross-sectional view illustrating a nonvolatile memory device according to the embodiment.

As illustrated in FIG. 20, in a nonvolatile memory device 3 according to the embodiment, the pillar protective film 19 is provided in addition to the configuration of the nonvolatile memory device 2 according to the second embodiment as previously described (see FIG. 16). This pillar protective film 19 can be formed after the process illustrated in FIG. 18, by for example the CVD method or the ALD method, by depositing a single layer silicon nitride film or a stacked film that includes a silicon nitride layer and a silicon oxide layer. By providing the pillar protective film 19, it is possible to reduce the set voltage of the variable resistance film 25, the same as for the second embodiment as described above, and in addition it is possible to reduce damage to the silicon diode film 22 and the variable resistance film 25 due to the annealing after forming the inter-layer insulating film 12. As a result, it is possible to obtain stable memory cell characteristics. The configuration, manufacturing method, operation, and effect of the embodiment other than that described above is the same as the second embodiment as described previously.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

For example, in each of the embodiments as described previously, when forming the silicon diode film 22, examples were described in which each amorphous silicon layer containing impurities were sequentially deposited, but the invention is not limited to this, for example, the impurities may be introduced by ion implantation. For example, after depositing a first polysilicon layer, ion implantation of phosphorus (P) or arsenic (As) may be carried out to form the n$^+$-type layer 22n, next, a second polysilicon layer is deposited to form the n$^-$-type layer 22i, and next, a third polysilicon layer is deposited, after which ion implantation of boron (B) is carried out to form the p$^+$-type layer 22p. Also, germanium (Ge) may be ion implanted into the n$^-$-type layer 22i. Further, after forming the third p$^+$-type layer 22p or the n$^+$-type layer 22n, a silicon layer into which no impurity is introduced may be formed. Also, instead of the n⁻-type layer 22*i*, an intrinsic semiconductor layer (i-type layer) or a p⁻-type layer may be provided between the n⁺-type layer 22*n* and the p⁺-type layer 22*p*.

According to the embodiments as described above, it is possible to realize a nonvolatile memory device with a low driving voltage and low power consumption.

What is claimed is:

1. A nonvolatile memory device, comprising:
   a substrate;
   a first word line interconnect layer including a plurality of first word lines extending in a first direction on the substrate;
   a second word line interconnect layer including a plurality of second word lines extending in the first direction on the first word line interconnect layer;
   a bit line interconnect layer provided between the first and second word line interconnect layers, and including a plurality of bit lines extending in a second direction that intersects the first direction;
   a first pillar disposed between each of the first word lines and each of the bit lines;
   a second pillar disposed between each of the second word lines and each of the bit lines;
   first charge bearing members containing a positive negative fixed charge, and provided on side faces of the first pillars; and
   second charge bearing members containing a positive fixed charge, and provided on side faces of the second pillars, the first pillars including:
     a first diode film provided with a p-type layer and an n-type layer, the p-type layer being disposed on the n-type layer; and
     a first variable resistance film stacked on the first diode film,
   the second pillars including:
     a second diode film provided with a p-type layer and an n-type layer, the n-type layer being disposed on the p-type layer; and
     a second variable resistance film stacked on the second diode film,
   an upper part of the first pillar having the p-type layer being narrower than a lower part of the first pillar having the n-type layer,
   an upper part of the second pillar having the n-type layer being narrower than a lower part of the second pillar having the p-type layer,
   each of the first pillars and the second pillars constituting a memory cell,
   the first charge bearing member being disposed on side faces of the p-type layer of the first diode film, and being not disposed on side faces of the n-type layer of the first diode film, and
   the second charge bearing member being disposed on side faces of the n-type layer of the second diode film, and being not disposed on side faces of the p-type layer of the second diode film.

2. The device according to claim 1, wherein the first charge bearing member is formed from alumina or hafnium oxide.

3. The device according to claim 1, wherein the first and second charge bearing members are films covering a periphery of the respective first and second pillars.

4. The device according to claim 1, wherein the word line interconnect layers and the bit line interconnect layers are stacked alternately.

5. The device according to claim 1, wherein the first and second diode films are formed from silicon.

6. The device according to claim 1, wherein the second charge bearing member is formed from silicon nitride.

* * * * *